US005444129A

United States Patent [19]

Kurz

[11] Patent Number: 5,444,129
[45] Date of Patent: Aug. 22, 1995

[54] STYRENE TYPE MONOMERS CONTAINING SUBSTITUENTS THEREON, E.G. UREA, AND POLYMERS AND COPOLYMERS THEREOF

[75] Inventor: David W. Kurz, Concord Township, Lake County, Ohio

[73] Assignee: Gould Inc., Eastlake, Ohio

[21] Appl. No.: 371,400

[22] Filed: Jan. 11, 1995

Related U.S. Application Data

[62] Division of Ser. No. 56,931, May 5, 1993, Pat. No. 5,401,825.

[51] Int. Cl.$^6$ .................... C08G 18/10; C08G 59/14; C08F 26/02
[52] U.S. Cl. .................... 525/528; 525/452; 525/187; 525/128; 526/302; 526/317.1; 526/328; 526/335; 526/341; 528/75
[58] Field of Search .............. 525/128, 187, 452, 528; 526/302, 317.1, 328, 335, 341; 528/75

[56] References Cited

U.S. PATENT DOCUMENTS

| | | | |
|---|---|---|---|
| 4,296,020 | 1/1981 | Magrans, Jr. | 260/37 N |
| 4,406,691 | 9/1983 | Szczepanski | 71/120 |
| 4,429,096 | 1/1984 | Schaefer | 526/287 |
| 4,437,880 | 3/1984 | Takahashi et al. | 71/120 |
| 4,473,579 | 9/1984 | Devries et al. | 424/282 |
| 4,519,834 | 5/1985 | Szczepanski | 71/100 |
| 4,604,439 | 8/1986 | Colvin et al. | 526/288 |
| 4,727,126 | 2/1988 | Chen | 526/302 |
| 4,845,291 | 7/1989 | Burgoyne, Jr. et al. | 564/307 |
| 4,853,478 | 8/1989 | Colvin et al. | 560/32 |
| 5,003,106 | 3/1991 | Devries | 564/54 |

OTHER PUBLICATIONS

An article entitled "Anionic Living Polymerization of p-N,N-Bis(trimethylsilyl)-aminostyrene, Synthesis of Linear Poly(p-Aminostyrene) with a Narrow Molecular Weight Distribution," *Journal of Polymer Science: Polymer Letters Edition*, vol. 21, pp. 395-401 (1983) John Wiley & Sons, Inc.: New York, New York.

An article entitled "Addition Polymers Synthesis and Investigation of Isomers of Aminostyrene," by O. N. Vlasavoskaya and N. V. Shorygina, *Soviet Plastics* (Translation of Russian Journal Plasticheskie Massy of Mar., 1967, by Rubber and Plastics Research Association of Great Britain), published by Rubber and Technical Press Limited: London, Mar., 1967, pp. 8-10.

An article entitled "Polymerization of p-Aminostyrene Derivative" by Tadashi Uragami, Hitoshi Hachiya, and Mizuho Sugihara, *Technol. Rep. Kansai Univ.*, Kansai Univ.: Osaka, Japan, 1983 vol. 24, pp. 165-172 (Eng.) Chem. Abstracts 99: 122973j.

*Primary Examiner*—James J. Seidleck
*Assistant Examiner*—Mary Critharis
*Attorney, Agent, or Firm*—Hudak & Shunk Co.

[57] ABSTRACT

A plurality of substituted styrene monomers, for example, urea substituted, is disclosed as well as polymers and copolymers made therefrom. Various thermoset plastic components can be reacted with the monomers, polymers, or copolymers of these substituted styrenes, as for example epoxy, which form a crosslinked system useful as an adhesive or a fiber reinforced substrate for circuit boards. The monomers are made by reacting aminostyrene type monomers with isocyanate containing molecules. One specific monomer is made by reacting a substituted aminostyrene with a monoisocyanate and has the following formula

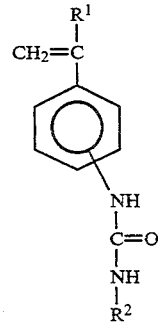

15 Claims, No Drawings

STYRENE TYPE MONOMERS CONTAINING SUBSTITUENTS THEREON, E.G. UREA, AND POLYMERS AND COPOLYMERS THEREOF

CROSS REFERENCE

This is a division of application Ser. No. 08/056,931, filed on May 5, 1993, of David W. Kurz, for "STYRENE TYPE MONOMERS CONTAINING SUBSTITUENTS THEREON, E.G., UREA, AND POLYMERS AND COPOLYMERS THEREOF", now U.S. Pat. No. 5,401,825.

FIELD OF THE INVENTION

The present invention relates to the preparation of substituted styrene type monomers as from the reaction of an alpha-substituted aminostyrene with various isocyanates, for example monoisocyanate, diisocyanate, etc., and to the free radical or thermal polymerization products thereof. The reaction product of the amino substituted styrene and isocyanate compounds can be further reacted into thermoset plastics compositions having functional groups reactive with the amine or isocyanate.

BACKGROUND OF THE INVENTION

Various compounds having amino-substituted benzene rings have been disclosed in the literature.

SUMMARY OF THE INVENTION

It is an aspect of this invention to create various amino-substituted styrene compounds and polymers made therefrom that can be reacted with other materials through either the vinylic unsaturation, the amino group, or through other functional groups attached through the amino group.

Various substituted styrene type monomers are formed by the reaction of at least one alpha-substituted aminostyrene with at least one isocyanate, for example a monoisocyanate, a diisocyanate, etc. The reaction generally proceeds at ambient temperature typically in an inert atmosphere under moisture-free conditions. The mole ratio of the isocyanate to the alpha-substituted aminostyrene to the isocyanate compound can vary greatly such as from 0.3 to 4. If one or more monoisocyanate compounds are utilized, the mole ratio of the aminostyrene to the monoisocyanate compound(s) can vary. However, when the isocyanate compound is a diisocyanate, a triisocyanate, etc., or blends thereof, the ratio of the polyisocyanate to the styrene is generally stoichiometric if the desired product is to have residual unreacted isocyanate groups. If a compound or monomer is desired such that it generally has aminostyrene end groups, an excess of the aminostyrene groups is generally used. Inasmuch as blends of various polyisocyanates can be utilized along with monoisocyanates and widely different mole ratios, a great variety (e.g. a statistical stew) of monomers can be produced by the reaction product of one or more isocyanate compounds with one or more alpha-substituted aminostyrene compounds. Both reactants generally are a liquid so that no solvent is generally required. The reaction products are usually a solid at room temperature.

The various monomers made from the reaction of isocyanates with aminostyrene molecules, which are generally solids can be polymerized by either melt polymerization or solution polymerization. In melt polymerization, the monomers are generally heated to the above melting point of the monomer. In either polymerization process, an inert atmosphere is generally utilized.

The above polymers and their monomers can be further reacted with other thermoset plastic components such as epoxies. Once such component is an epoxy resin which can be utilized in an amount of from about 1 percent to about 99 percent by weight based upon the total weight of the epoxy resin and the polymer.

DETAILED DESCRIPTION

According to the present invention, numerous different monomers can be formed which are the reaction product of one or more alpha-substituted amino-styrenes having the formula

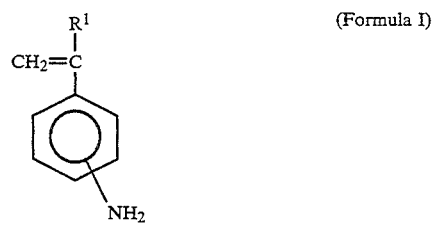

(Formula I)

and one or more polyisocyanates having the formula $R^2-(NCO)_x$, where x represents the average number of NCO groups and is any number or fraction thereof from about 1 to about 4. The type of monomer formed by the reaction product will vary with the mole ratio of aminostyrene to the isocyanate compound. During some actions, as will be better understood by reference to the description hereinbelow, no single particular reaction product will be formed but rather two or more products can be formed, often times the result of competing reactions, or the like. In effect, some of the monomer reaction end products will be a statistical stew.

The $R^1$ substituent of the styrene compound can be hydrogen, an aliphatic and preferably an alkyl having from 1 to 44 carbon atoms, a halogen such as fluorine, chlorine, bromine, iodine, or an aryl or an alkyl substituted aryl having a total of from 6 to 40 carbon atoms with specific examples including diphenyl, naphthyl, anthracene, decacyclene, and the like, desirably an alkyl having from 1 to 18 carbon atoms, more desirably from 1 to 8 carbon atoms, and preferably methyl. Hydrogen and methyl are highly preferred. The amine group can be in the ortho, meta, or para position on the benzene ring with the para position substitution being preferred.

With regard to the isocyanate compound, as noted above, x can vary from about 1 to about 4, and desirably from about 1 to about 3. Thus, the isocyanate compound can be a monoisocyanate, a diisocyanate, a triisocyanate, or any blend thereof, as for example where x is approximately 2.5, that is approximately ½ diisocyanate and ½ triisocyanate. $R^2$ can be an aliphatic such as an alkyl containing from 2 to 20 carbon atoms, a cycloaliphatic such as a cycloalkyl having from 4 to 20 carbon atoms, an aromatic or an alkyl substituted aromatic having from 6 to 20 carbon atoms, an aromatic substituted alkyl having from 6 to 20 carbon atoms, or combinations thereof. Examples of monoisocyanates include phenyl isocyanate, o-tolyl isocyanate, m-tolyl isocyanate, p-tolyl isocyanate, and n-butyl isocyanate. Examples of polyisocyanates include 4,4'-methylene-bis-(phenyl isocyanate) (MDI); m-xylylene diisocyanate (XDI), phenylene-1,4-diisocyanate, naphthalene-1,5-diisocyanate, diphenylmethane-3,3'-dimethoxy-4,4'-diisocyanate and toluene diisocyanate (TDI); as well as aliphatic diisocyanates such as hexamethylene diisocyanate, octyl decyl diisocyanate, isophorone diisocyanate (IPDI), 1,4-cyclohexyldiisocyanate (CHDI), decane-1,10-diisocyanate, and dicyclohexylmethane-4,4'-diisocyanate, 1,6-diisocyanatohexane, dicyclohexamethane-4,4'-diisocyanate (hydrogenated MDI). Generally, 1,6-diisocyanatohexane is preferred. When the final product needs high temperature stability, then aromatic isocyanates are preferred.

The isocyanate compounds can also be the reaction product of the above-mentioned polyisocyanates where x is about 2 to about 3, and low molecular weight polyols or polyamines. The polyols are desirably poly(alkylene oxides) or polyesters well known to the art. Preferably, the polyols and polyamines are diols or diamines. The molecular weight of the polyols and polyamines are desirably less than 300. The polyols and polyamines desirably are composed of atoms selected from hydrogen, carbon, nitrogen and oxygen. The reaction product of the aminostyrenes and the isocyanates may also be post reacted with said polyols or said polyamines if there are residual unreacted isocyanate groups after the first reaction.

The reaction product of one or more amino-styrenes with one or more monoisocyanates may yield one or more compounds of the formula

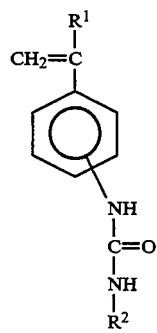

(Formula II)

where $R^1$ and $R^2$ are as noted above.

The mole ratio of monoisocyanate to the alpha-substituted aminostyrene is desirably from about 0.5 to about 1.5 with from about 0.9 to about 1.1 being preferred. Since both compounds are generally liquid at ambient temperature, a solvent is not utilized. The reaction generally occurs at low temperatures but above the melting point of the reactants, and generally from about −30° C. to about 100° C., desirably from about −20° C. to about 50° C., with from about −5° C. to about 5° or 30° C. being preferred under atmospheric pressure. An inert or dry atmosphere is preferably utilized such as nitrogen so that the reaction is free of water or moisture.

If the one or more polyisocyanates are diisocyanates, and generally a equal mole amounts of each reactant are utilized, the reaction product is generally represented by formula III

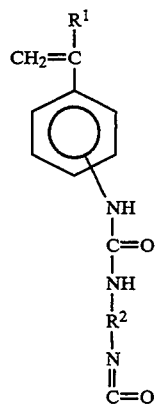

(Formula III)

where $R^1$ and $R^2$ are as set forth above.

If the polyisocyanate compound is a triisocyanate, a monomer is made which can generally be represented by formula IVA

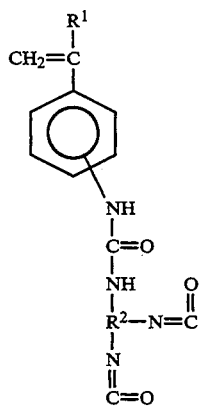

(Formula IVA)

where $R^1$ and $R^2$ are as set forth above.

A monomer can be made generally represented by formula IVB utilizing two diisocyanates, that is the reaction of two individual diisocyanates, either the same or different, wherein the diisocyanates reacts off of the amine group.

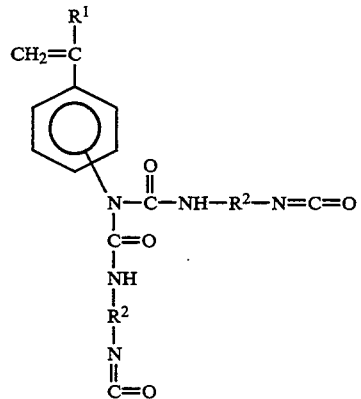

(Formula IVB)

It should be appreciated to one skilled in the art that a large number of monomers can be made by utilizing a singe specific type of aminostyrene compound as well as a specific type of a polyisocyanate. Of course, when a mixture of two or more different types of aminostyrene compounds are utilized and/or a mixture of two or more different types of polyisocyanates, a vast number of monomer blends containing two or more different types of monomers therein are produced. The amount of a specific type of monomer within a particular monomer blend will vary depending upon the amount of initial components utilized as well as the result of completing reactions. Generally, monomers made from one aminostyrene compound and one polyisocyanate compound such as those set forth in formulas III and IV are desired.

The mole ratio of the polyisocyanate compound to the para-aminostyrene compound utilized to form the formula III and IVA type compounds is desirably from about 0.80 to about 1.80 and preferably from 0.90 or 0.98 to about 1.1 or 1.5. The reaction conditions for formation of the formula III and IVA monomers are generally very similar to the formation of the formula II monomer as set forth hereinabove and thus the same is fully incorporated and not repeated for sake of brevity.

When two diisocyanates are utilized to form a monomer having an allophanate-like group therein, e.g., formula IVB, the mole ratio of the polyisocyanate, that is diisocyanate to the para-aminostyrene compound is desirably from about 1.8 to about 4.0 and preferably from about 2.0 to about 2.5. The reaction conditions are once again generally the same with regard to the formulation of the formula II monomer as set forth hereinabove.

If an excess of the aminostyrene compound is utilized, that is a molar ratio deficiency of the polyisocyanate is utilized, the residual isocyanate end groups will react with the excess aminostyrene. Depending upon the excess of the aminostyrene compound, a blend of isocyanate terminated monomers will exist as well as a monomer generally endcapped by two aminostyrene groups, that is a monomer which generally has two urea groups therein as well as two styrene groups therein which generally can be represented by formula VA.

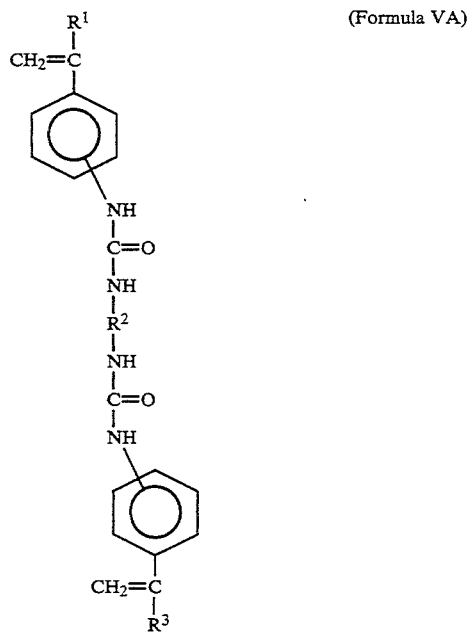

(Formula VA)

wherein $R^1$ and $R^2$ are as set forth hereinabove. $R^3$ independently is $R^1$ and therefore can be hydrogen, an aliphatic having from 1 to 44 carbon atoms, a halogen, an aryl or an alkyl substituted aryl having from 6 to 40 carbon atoms, and the like. Accordingly, $R^3$, independently, can be the same or different than $R^1$. The molar ratio utilized to produce at least a small amount of the formula VA type monomer requires a slight excess of the aminostyrene and, hence, the molar ratio of polyisocyanate to the aminostyrene is more desirably from about 0.33 to about 0.78, and desirably from about 0.46 to about 0.49. The reaction conditions are the same as set forth above for the other formulas.

Another and preferred way of making formulation VA relates to utilizing the method of making formula and subsequently reacting formula III with the para-aminostyrene of formula I. In this embodiment, the various mole ratios and reaction conditions for making the formula III compound are the same as set forth above and the ratio of the para-aminostyrene to the compound of formula III is up to 1.5, and desirably is up to about 1.0 or 1.1. The reaction conditions are similar to the other reactions to form compounds of formula II through IVA.

Other monomers which can be formed if an excess of aminostyrene compound is utilized is set forth by formula VB and VC. The compound of formula VB is made by using 3 moles of aminostyrene and desirably from about 1.75 to about 2.25, preferably about 2 moles of a diisocyanate. Alternatively, this compound can be made from 1 mole of the compound of formula IVB reacted with 2 moles of aminostyrene. $R^1$, $R^2$, and $R^3$ can independently be the same moieties as in previous structures. When more than one $R^3$ appears in a structure, $R^3$ can be different moieties within that structure. The reaction conditions are similar to those above. The molar ratios of the reactants can vary by 20 to 40 mole percent to compensate for reactivity differences between the reactants. The compound of formula VC is made from a triisocyanate and about three aminostyrene molecules.

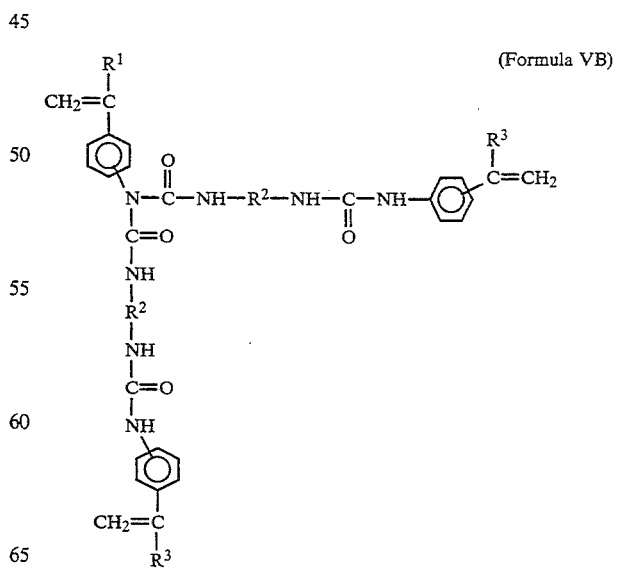

(Formula VB)

or

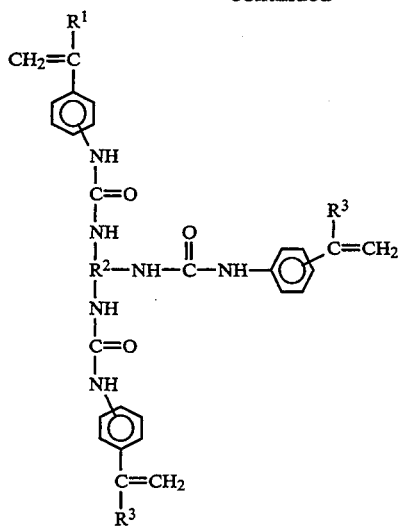

(Formula VC)

The reaction conditions for producing monomers which generally have two or more styrene groups on the end portions thereof or a blend of the same with monomers of the type set forth in formulas III and IV are the same as set forth hereinabove. That is, generally the reaction occurs at low temperatures as from about −30° C. to about 100° C. without the use of any catalyst.

It should once again be apparent that a large number of specific monomers can be produced having at least a portion of the formula VA, VB and/or VC compounds therein, that is from at least 1 percent up to 100 weight percent. A mixture of two or more different types of aminostyrene compounds can be utilized and/or a mixture of two or more different types of polyisocyanates are utilized.

Thus, as apparent from the preceding discussion, a host or a myriad of different types of monomers can be formed according to the present invention and often times the resulting reaction product is a so-called statistical stew. Examples of specific monomers which are preferred include o, m and p-tolyl urea styrene; hexyl diurea styrene, butyl urea styrene, octadecyl urea styrene, phenyl urea styrene, and 1,6-hexyl isocyanate urea styrene. These type monomers will be referred to herein by the term monomers derived from aminostyrene.

The above monomers whether made from one or more isocyanate compounds are generally amphiphilic and thus can be utilized in forming emulsions as well as for controlling the structure of liquid crystals. The above monomers can also be utilized as crosslinking agents, as coatings, as adhesives, and as thermosets, as well as intermediates for forming sizing agents and the like.

Since all of the above monomers have unsaturation sites therein, they can readily be solution or melt polymerized by free radical, cationic or anionic polymerization. The use of these monomers in anionic polymerization may benefit from protecting groups as disclosed in J. Polym. Sci.; Polym. Lett. Ed., 21, p 395 (1983) which is hereby incorporated by reference.

When polymerized according to melt polymerization, the various above described monomers are heated above their melting point generally in the absence of any solvent as well as the absence of any initiator/catalyst and are readily polymerized. These amino styrene monomers similar to styrene monomers are believed to be capable of self-initiated polymerization. Melt polymerization is preferred and can be conducted after epoxy oligomers have reacted with the monomers of this invention. The polymerization occurs readily at temperatures 10° C. or more above the melting temperature of the monomers or desirably above 150° C. or preferably from 190° C. to 250° C. The various above styrene class of monomers are readily melt polymerized through reaction of the vinyl group and thus contains pendent urea or isocyanate groups thereon. All the polymerizations are preferably conducted in an inert atmosphere.

Although generally only one specific type of monomer is polymerized, it is within the scope of the present invention to polymerize blends of the same type of monomers, for example blends formula II type compounds, blends of formula III type compounds, blends of formula V type compounds, blends of formula VI type compounds, and the like. Moreover, blends of monomers represented by two or more different formulas II through V, such as formulas II and III, formulas III and V, etc. can also be utilized. It should thus be apparent that a very large number of polymers can be produced according to the scope of the present invention.

Free radical polymerization can also be carried out in the presence of a solvent. The solvent is generally an organic compound which has a boiling point greater than the polymerization temperature. Free radical polymerization of the above-noted compounds of the present invention generally occurs at a temperature range of from about 40 to about 150° C., desirably from about 50 to about 100° C., and preferably from about 50 to about 70° C. Suitable solvents include various aromatic compounds or alkyl substituted aromatic compounds having a total of from 6 to 20 carbon atoms, with specific examples include benzene, xylene, toluene, cresol, and the like. Various aliphatic compounds can be utilized such as the various alkanes having from 6 to about 10 carbon atoms, with specific examples including hexane, petroleum, ether (i.e., mostly heptane), and the like. Chlorinated aliphatic compounds such as chlorinated alkyl compounds having a total of from about 1 to about 5 carbon atoms can also be utilized with specific examples including chloroform, methylene chloride, and the like. The various ketones having from 3 to about 10 carbon atoms can also be utilized such as acetone, methyl ethyl ketone, methyl isobutylketone, and the like. Alcohols having from 1 to 5 carbon atoms can also be utilized such as methyl alcohol, ethyl alcohol, isopropyl alcohol, and the like.

The free radical initiator which is utilized to polymerize the above-noted monomers can generally be any catalyst well known to the art and to the literature. For example, various organic peroxides, acyl peroxides, peresters, and hydroperoxides can be utilized such as benzoyl peroxide, dicumyl peroxide, cumene hydroperoxide, paramethane hydroperoxide, acetyl peroxide, t-butyl perbenzoate, and the like, used alone or with redox systems. Diazo compounds such as azobisisobutyronitrile (AIBN), and the like; persulfate salts such as sodium, potassium, and ammonium persulfate, used alone or with redox systems; and ultraviolet light with photo-sensitive agents such as benzophenone, triphenylphosphine, organic diazos, and the like may be used as the free radical initiator. Generally, AIBN is preferred.

The free radical catalyst must be soluble in a solvent and the amount thereof present is generally up to about 2.0, desirably from about 0.001 to about 2.0 parts by weight, and preferably from about 0.001 to about 0.01 parts by weight for every 100 grams of the monomer.

In lieu of free radical polymerization, anionic polymerization can be utilized. Therein naphthalene sodium, n-butyl lithium, or other anionic initiators well known to the art and to the literature are used. Through the use of anionic polymerization systems, the molecular weight can be controlled in a rather precise manner. In such polymerization systems, an inert gas such as nitrogen is generally utilized to remove contaminates such as water, moisture, carbon dioxide, and the like. Anionic polymerizations are generally carried out at very low temperatures such as from about $-70°$ C. to about $50°$ C., and desirably from about $-40°$ C. to about $-20°$ C.

The various monomers discussed hereinabove can also be generally polymerized via cationic polymerization. The cationic polymerization system can produce polymers of molecular weights up to a few thousand if initiated by strong acids such as perchloric, sulfuric, phosphoric, fluoro- and chlorosulfonic, methanesulfonic, and trifluoromethanesulfonic. Polymerizations using these initiators can be performed up to 200–300° C. If cationic polymerization is initiated with Lewis acids or Lewis acids in combination with a protogen, higher molecular weights can be achieved. Lewis acid initiators include metal halides (e.g., $AlCl_3$, $BF_3$, $SnCl_4$, $SbCl_5$, $ZnCl_2$, $TiCl_4$, $PCl_5$), organometallic derivatives (e.g. $RAlCl_2$, $R_2AlCl$, $R_3Al$), and oxyhalides (e.g., $POCl_3$, $CrO_2Cl$, $SOCl_2$, $VOCl_3$). Polymerizations with Lewis acid initiators are generally in solvents at temperatures as low as $-100°$ C. and lower. Other cationic initiators include acetyl perchlorate, iodine, electrolytic initiation, and ionizing radiation.

The monomers of this invention can also be copolymerized with unsaturated monomers that polymerize through their carbon-carbon double bonds. The monomers that can be used include styrene or alkyl substituted styrene having 8 to 12 carbon atoms, dienes having 4 to 8 carbon atoms, acrylates and alkyl acrylates having 3 to 20 carbon atoms, acrylic acids having 3 to 8 carbon atoms, or acrylonitrile monomers having 3 to 8 carbon atoms. The weight ratio of monomers of this invention to the other comonomers listed above is desirably from about 10:90 to 90:10, and preferably from about 30:70 to about 70:30.

Regardless of the type of polymerization, the weight average molecular weight of the various linear polymers of the present invention is generally from about 10,000 to about 2,500,000, and preferably from about 20,000 to about 1,000,000. Naturally, the molecular weight utilized will often depend upon a desired end use and properties. The crosslinked polymers of this invention would higher weights. These can have high crosslink density.

Numerous different type of monomers exist, only some of which are represented by the above formulas II through V. That is, as noted above, the reaction product can yield various blends of monomers or hybrid types of monomers with specific formulas II through V being representative of various classes of monomers so produced. With regard to the specific types of formulas, when a monomer of formula II is polymerized, a polymer is generally produced having the following repeat unit incorporated therein

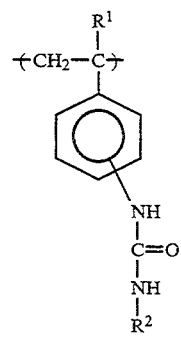
(Formula VI)

Similarly, the compound of formula III when polymerized will have the following repeat unit.

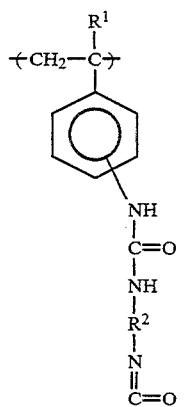
(Formula VII)

Similarly, when a monomer of formula IV is polymerized, the repeat unit will have the following formula

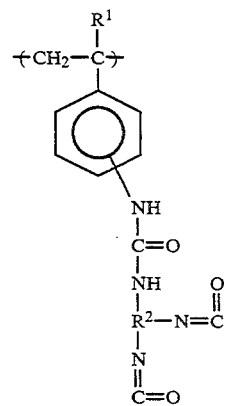
(Formula VIII)

When the monomer of formula IVB is polymerized, the repeat unit would have the following formula

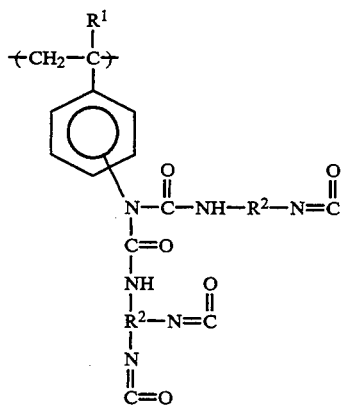

(Formula IX)

When one of the unsaturated groups of the monomer of formula type VA is polymerized, the repeat unit will have the following formula

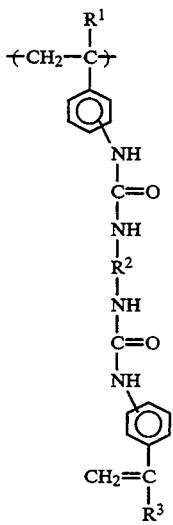

(Formula X)

Of course, if the second unsaturated group is polymerized, a highly crosslinked network or polymer system will be generated.

Similarly, if the unsaturated groups of the monomer of formula type VB is polymerized, the repeat unit would have the following formula (Formula XI)

Of course, it is to be understood that it is within the concept of the present invention that the above monomers (reaction product of isocyanates with aminostyrene) can be polymerized to form homopolymers or copolymers constituting at least 100 percent of the repeat units, i.e. homopolymer, or can generally constitute anywhere from about 5 to about 95 percent of a copolymer, desirably from about 20 to about 80 percent, with the remainder of the repeat units being generated from one or more of the other comonomers as described hereinabove which were not made from aminostyrenes.

The above discussed polymers and copolymers as well as the various blends thereof can further be reacted with various compounds such as an epoxy to yield a graft type polymer.

Although the substituted amino styrene monomers are desirably reacted first with an isocyanate and then polymerized, it is also possible to first polymerize the aminostyrene into a polymer and then react the pendant amino groups with an isocyanate of the formula $R(NCO)_x$. In that the $NH_2$ group may inhibit polymerization, it is anticipated that the $NH_2$ group can be reacted with various protecting groups for the amine functionality prior to polymerization and subsequent to polymerization deprotected to regenerate the $NH_2$ group. Thus, a polymer having a structural repeat unit of

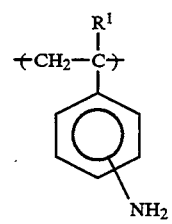

can be generated from these monomers with their protecting group. Examples of protecting groups include dansyl chloride forming a dansyl derivative; ketones forming a ketimine; or using a silane forming a trisilyl derivative. The substituted amino styrene monomers or amine protected derivatives thereof can also be copolymerized with the unsaturated monomers that polymerize through their double bond previously listed. Subsequent to polymerization and any deprotecting reactions for the amines, the polymers are desirably reacted with the polyisocyanates R(NCO)$_x$.

The polymers or copolymers made from monomeric reaction products of aminostyrenes and isocyanates or blends thereof, or the monomeric reaction products themselves, can react with an epoxy resin. Generally, any epoxy resin known to the art and to the literature chloroacetyls such as butadiene dioxide, vinylcyclohexane dioxide, epoxidized polybutadiene, and bis(2,3epoxycyclopentyl)ether. A more comprehensive list of epoxy resins can be found in *Handbook of Epoxy Resins,* by Henry Lee and Kris Neville, McGraw-Hill, Inc., 1967, which is hereby incorporated by reference. A highly preferred epoxy resin is diglycidyl ethers of bisphenol A (DGEBA) having the following formula:

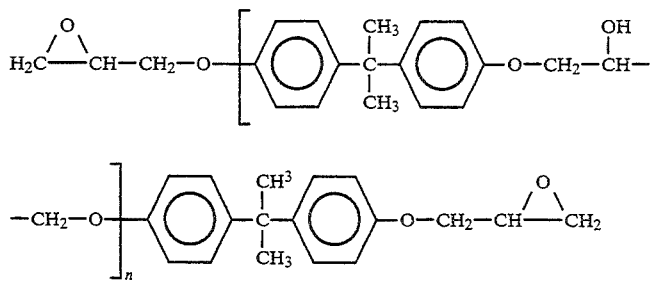

can be utilized. The amount of epoxy resin which can be reacted with the above polymers or monomers is generally from about 0.1 percent to about 99 percent by weight and desirably from about to 50 to about 95 percent by weight, based upon the total weight of the epoxy resin and the above-noted monomers or polymers of the present invention. Generally, depending upon desired end use and desired properties, a high amount of monomer or polymer can be utilized, or a high amount of epoxy, or anything in between. The reaction with the epoxy is generally carried out at elevated temperatures as from about 100 to about 250° C., desirably from about 125 to about 225° C., and preferably from about 150° to about 200° C. Generally, a catalyst is not utilized and the reaction is conducted in an inert atmosphere.

Types of epoxy resins which can be utilized include glycidyl ethers of bisphenols such as diglycidyl ether of tetrabromobisphenol A; glycidyl ethers of polynuclear phenols; glycidyl ethers of aliphatic polyols such as chlorine-containing aliphatic diepoxy and polyepichlorohydrin; glycidyl esters such as aliphatic diacid glycidyl esters and epoxidized phenolphthalein; glycidyl epoxies containing nitrogen such as glycidyl amides and amide-containing epoxies; glycidyl derivatives of cyanuric acid; glycidyl resins from melamines; epoxy resin made from diphenolic acid; glycidyl amines such as triglycidyl ether amine of p-aminophenol and bis(2,3-epoxy-propyl)methylpropylammonium p-toluenesulfonate; glycidyl triazines; thioglycidyl resins such as epoxidized bisulfide; silicon-glycidyl resins such as 1,4-bis[2,3-epoxypropoxy)dimethylsilyl]; and fluorine glycidyl resins.

Still other examples of suitable epoxy resins include glycidyl ethers of novolac resins such as epoxylated phenol-formaldehyde novolac resin; glycidyl ethers of mono-, di-, and trihydric phenols.

Still further resins are those which are synthesized from mono-epoxies other than epihalohydrins including epoxy resins made from unsaturated monoepoxies such as polyallyl glycidyl ether and glycidyl sorbate dimer; epoxy resins from monoepoxy alcohols; epoxy resins from monoepoxies by ester interchange; epoxy resins from glycidyl aidehyde; polyglycidyl compounds containing unsaturation such as allyl-substituted diglycidyl ether of bisphenol A; epoxy-resin adducts of the above; and epoxy resins which are synthesized from olefins and wherein n is an integer from 0 to 100, and preferably from 10 to 20.

The monomers or polymers of this invention can be utilized as a matrix resin either with or without fiber reinforcement. Fillers could optionally be used with the matrix resin. Depending on whether the monomers or polymers had residual unreacted double bonds, isocyanate groups, or amine groups, they crosslink, forming a cured product with or without other reactive compounds. If they had residual double bonds, they could be crosslinked by the addition of a free radical source as previously described for polymerization. If they had unreacted isocyanate groups, they could be crosslinked by adding a second component reactive with isocyanate groups. These could be polyols, polyamines, polycarboxylic acids, water, or a combination thereof. The addition of water to a composition having unreacted isocyanate groups would result in a foamed product due to the generation of $CO_2$. The addition of difunctional epoxy resins to either the above-mentioned monomers or polymers derived from aminostyrenes, would result in epoxy terminated epoxy-terminated compounds that can be cured with traditional epoxy curatives or with additional monomers or polymers derived from aminostyrene. If monomers derived from aminostyrene are reacted with epoxy resins, the resulting composition can also be cured through free radical processes. Solvents may be used in the above reactions.

With regard to the matrix resins of the present invention, they can be utilized as various articles such as printed circuit boards, electrical equipment, electrical housings. A preferred area is as an adhesive wherein the above-described reaction products of aminostyrenes and isocyanates are reacted with a diepoxide or polyepoxide resin. These are applied to a phenolic prepreg paper substrate. More preferably, the epoxy is applied to one surface of the prepregged substrate and the monomers or polymer derived from amino styrenes is applied to a surface to a similar substrate. The two substrates are then brought together and under pressure and heat where a chemical reaction occurs. The temperature can be above the melting point of the monomers or from about 100° to about 200° C. Such an end use finds great utility in the preparation of printed circuit boards, especially since the reacted epoxy polymer composition has good vapor barrier resistance.

The fibers used in the prepreg may be Kevlar TM, fiberglass, carbon fibers, graphite fibers, pyrolyzed polyacrylonitrile fibers, and other reinforcing fibers.

The invention will be better understood by reference to the following examples.

EXAMPLES

Preparation of Derivatives from Aminostyrene o-Tolyl Urea Styrene: 1.00 g (8.40 mmol) of p-aminostyrene (99% Tokyo Kasei) was added to a 250 ml round bottom flask containing 10 ml of chloroform. After ten minutes of mixing, 1.12 g (8.41 mmol) of o-tolyl isocyanate (99% Aldrich) was added dropwise. Within seconds, a yellow precipitate formed. The precipitate was filtered to remove the reaction liquid, then washed with 20 ml of chloroform resulting in pale yellow powder (1.45 g, 68% crude yield, mp=193° C.).

m-Tolyl Urea Styrene: 1.00 g (8.40 mmol) of p-aminostyrene (99% Tokyo Kasei) was added to a 250 ml round bottom flask containing 10 ml of chloroform. After ten minutes of mixing, 1.12 g (8.41 mmol) of m-tolyl isocyanate (99% Aldrich) was added dropwise. Within seconds, a white, pinkish precipitate formed. Chloroform (20 ml) was added to aid stirring. The precipitate was filtered to remove the reaction liquid, then washed with 20 ml of chloroform resulting in a white powder (166 g, 78% crude yield, mp=203° C.).

p-Tolyl Urea Styrene: 1.00 g (8.40 mmol) of p-aminostyrene (99% Tokyo Kasei) was added to a 250 ml round bottom flask containing 10 ml of chloroform. After ten minutes of mixing, 1.12 g (8.41 mmol) of p-tolyl isocyanate (99% Aldrich) was added dropwise. Within seconds, a white, pinkish precipitate formed. Chloroform (20 ml) was added to aid stirring. The precipitate was filtered to remove the reaction liquid, then washed with 20 ml of chloroform resulting in a pale yellow powder (1.85 g, 87% crude yield, mp=242° C.).

1,6-Hexyl Urea Styrene Dimer: 1.00 g (8.40 mmol) of p-aminostyrene (99% Tokyo Kasei) was added to a 250 ml round bottom flask containing 100 ml of chloroform. After ten minutes of mixing, 0.706 g (4.20 mmol) of 1,6-diisocyanato hexane (98% Aldrich) was added dropwise. After twenty minutes, a white, pinkish precipitate formed. The precipitate was filtered to remove the reaction liquid, then washed with 20 ml of chloroform resulting in a pale white powder (0.87 g, 51% crude yield, mp=228° C.).

n-Butyl Urea Styrene: 1.00 g (8.40 mmol) of p-aminostyrene (99% Tokyo Kasei) was added to a 250 ml round bottom flask containing 10 ml of chloroform. After ten minutes of mixing, 0.84 g (8.47 mmol) of n-butyl isocyanate (99% Aldrich) was added dropwise. Within seconds, a yellow precipitate formed. Chloroform (20 ml) was added to aid stirring. The precipitate was filtered to remove the reaction liquid, then washed with 20 ml of chloroform resulting in a pale yellow powder (1.78 g, 96% crude yield, mp=116° C.).

n-Octadecyl Urea Styrene: 1.00 g (8.40 mmol) of p-aminostyrene (99% Tokyo Kasei) was added to a 250 ml round bottom flask containing 10 ml of chloroform. After ten minutes of mixing, 2.52 g (8.41 mmol) of n-octadecyl isocyanate (98% Aldrich) was added dropwise. Within seconds, a yellow precipitate formed. Chloroform (20 ml) was added to aid stirring. The precipitate was filtered to remove the reaction liquid, then washed with 20 ml of chloroform resulting in a pale yellow powder (3.38 g, 96.0% crude yield, mp=109° C.).

1,6-Hexyl Isocyanate Urea Styrene: 1.00 g (8.40 mmol) of p-aminostyrene (99% Tokyo Kasei) was added to a 250 ml round bottom flask containing 100 ml of chloroform. After ten minutes of mixing, 1.42 g (8.40 mmol) of 1,6-diisocyanato hexane (98% Aldrich) was added dropwise. Within twenty minutes, a yellow precipitate formed. The precipitate was filtered to remove the reaction liquid, then washed with 20 ml chloroform resulting in a pale yellow powder (2.23 g, 92.1% crude yield, mp=91° C.).

Phenyl Urea Styrene: 5.00 g (42.0 mmol) of p-aminostyrene (99% Tokyo Kasei) was added to a 250 ml round bottom flask. After ten minutes of mixing, 5.00 g (42.0 mmol) of phenyl isocyanate (99% Aldrich) was added dropwise. Within seconds, a yellow precipitate formed. Chloroform (20 ml) was added to aid stirring. The precipitate was filtered to remove the reaction liquid, then washed with 20 ml of chloroform resulting in a pale yellow powder (8.60 g, 86.0 % crude yield, mp=213° C.).

Cross-linking Reactions:

Phenyl urea styrene (0.11 g) was added to DER 331 (0.86 g) in a 10 ml vial. The mixture was heated for one hour at 110° C. resulting in a rubbery mass. Upon cooling to room temperature, the mixture hardened into an insoluble mass.

Phenyl urea styrene (0.16 g) was added to DER 661 (1.83 g) in a 10 ml vial. The mixture was heated for one hour at 110° C., resulting in a rubbery mass. Upon cooling to room temperature, the mixture hardened into a insoluble mass.

Phenyl urea styrene (0.18 g) was added to DER 664 (1.63 g) in a 10 ml vial. The mixture was heated for one hour at 110° C., resulting in a rubbery mass. Upon cooling to room temperature, the mixture hardened into an insoluble mass.

Phenyl urea styrene (0.20 g) was added to DER 667 (1.95 g) in a 10 ml vial. The mixture was heated for one hour at 110° C., resulting in a rubbery mass. Upon cooling to room temperature, the mixture hardened into an insoluble mass.

The DER resins are the epoxidized reaction products of epichlorohydrin and bisphenol A as shown in the formula in the text. DER 331 has an n value of 0, DER 661 has an n value of 3, DER 664 has an n value of 5 or 6, and DER 667 has an n value of 9.

Polymerizations:

Phenyl urea styrene (1.20 mg) was added to a DSC cell. The sample was heated 10° C./min under nitrogen to 50° C. past the melting point (215.6° C.). After the sample cooled to room temperature, the sample was heated 10° C./min to 600° C. showing a Tg at 175° C. and no melting point. FT-IR confirmed the polymerization by the disappearance of absorption peaks at the frequencies associated with unsaturation.

o-Tolylureastyrene (2.82 mg) was added to a DSC cell. The sample was heated 10° C./min under nitrogen to 50° C. past the melting point (193.1° C.). After the sample cooled to room temperature, the sample was heated 10° C./min 10° to 600° C. showing a Tg at 200° C. and no melting point. FT-IR confirmed the polymerization by the disappearance of absorption peaks at the frequencies associated with unsaturation.

m-Tolylureastyrene (1.54 mg) was added to a DSC cell. The sample was heated 10° C./min under nitrogen to 50° C. past the melting point (203.1° C.). After the sample cooled to room temperature, the sample was heated 10° C./min to 600° C. showing a Tg at 200° C. and no melting point. FT-IR confirmed the polymerization by the disappearance of absorption peaks at the frequencies associated with unsaturation.

p-Tolylureastyrene (1.37 mg) was added to a DSC cell. The sample was heated 10° C./min under nitrogen to 50° C. past the melting point (242.4° C.). After the sample cooled to room temperature, the sample was heated 10° C./min to 600° C. showing a Tg at 225° C. and no melting point. FT-IR confirmed the polymerization by the disappearance of absorption peaks at the frequencies associated with unsaturation.

Diisohexylureastyrene (1.43) was added to a DSC cell. The sample was heated 10° C./min under nitrogen to 50° C. past the melting point (228.4° C.). After the sample cooled to room temperature, the sample was heated 10° C./min to 600° C. showing a Tg at 250° C. and no melting point. FT-IR confirmed the polymerization by the disappearance of absorption peaks at the frequencies associated with unsaturation.

Copolymerization:

Styrene (4.5 g) and phenyl urea styrene (0.5 g) were added to 50 ml of chloroform. AIBN (5.0 mg) was added and the mixture heated over night at reflux. The resulting copolymer was dried resulting in a rubbery mass (4.7 g, 94% yield). The structure was confirmed by $^{13}C$ NMR.

While in accordance with the Patent Statutes, the best mode and preferred embodiment has been set forth, the scope of the invention is not limited thereto, but rather by the scope of the attached claims.

What is claimed is:

1. A thermoset composition comprising the reaction product of at least one aminostyrene compound and at least one polyisocyanate having the formula $R^2-(NCO)_x$, where x is from about 1 to about 4, reacted with one or more epoxy oligomers having two or more reactive epoxy groups, said aminostyrene compound having the formula:

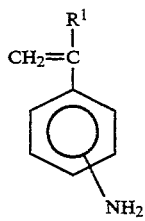 (Formula I)

wherein $R^1$ is H, fluorine, chlorine, iodine, bromine, an alkyl having 1 to 44 carbon atoms, an aryl or alkyl substituted aryl having 6 to 40 carbon atoms, and wherein $R^2$ is an alkyl having from 2 to 20 carbon atoms, a cycloalkyl having 4 to 20 carbon atoms, an aromatic or an alkyl substituted aromatic having 6 to 20 carbon atoms, or an aromatic substituted alkyl having 6 to 20 carbon atoms.

2. A thermoset composition according to claim 1, wherein $R^1$ is H or an alkyl having 1 to 8 carbon atoms, $R^2$ is an alkyl, having from 2 to 20 carbon atoms, a cycloalkyl having 4 to 20 carbon atoms, or an aromatic or an alkyl substituted aromatic having 6 to 20 carbon atoms or an aromatic substituted alkyl having 6 to 20 carbon atoms.

3. A thermoset composition according to claim 2, wherein the value of x is about 1 and the mole ratio of $R^2-(NCO)_x$ to aminostyrene is from about 0.9 to about 1.1.

4. A thermoset composition according to claim 2, wherein the value of x is from about 2 to 3 and the mole ratio of $R^2-(NCO)_x$ to aminostyrene is from about 0.8 to about 1.8.

5. A thermoset composition according to claim 2, wherein the value of x is about 2 and the mole ratio of $R^2-(NCO)_x$ to aminostyrene is from about 1.9 to about 4.0.

6. A thermoset composition according to claim 2, wherein the value of x is from about 2 to about 3 and the ratio of $R^2-(NCO)_x$ to aminostyrene is from about 0.33 to about 0.78.

7. A copolymer made by polymerizing at least one urea substituted monomer with one or more styrene or alkyl substituted styrenes having 8 to 12 carbon atoms; one or more dienes having 4 to 8 carbon atoms; one or more acrylates or alkyl acrylates having 3 to 20 carbon atoms; one or more acrylic acids having 3 to 8 carbon atoms; or one or more acrylonitrile monomers having 3 to 8 carbon atoms, said urea substituted monomer being the reaction product of at least one aminostyrene compound having the formula

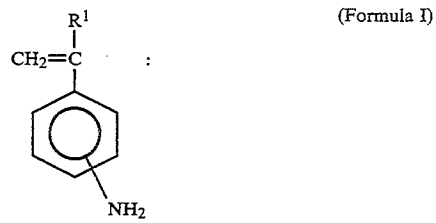

and at least one polyisocyanate having the formula $R2-(NCO)_x$, where x is from about 1 to about 4, where $R^1$ is H or an alkyl having 1 to 8 carbon atoms, and where $R^2$ is an alkyl or cycloalkyl having 4 to 20 carbon atoms or an aromatic or alkyl substituted aromatic having 6 to 20 carbon atoms or an aromatic substituted alkyl having 6 to 20 carbon atoms.

8. A copolymer according to claim 7, wherein x is about 1.

9. A copolymer according to claim 8, wherein x is from about 2 to about 3.

10. A thermoset composition comprising a polymer reacted with one or more epoxy oligomers having two or more reactive epoxy groups, said polymer made by polymerizing at least one monomer, said monomer being the reaction product of at least one aminostyrene compound having the formula,

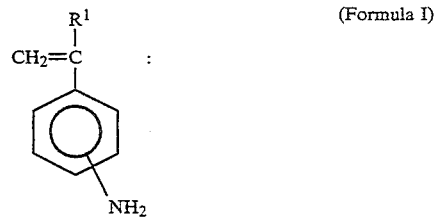

and at least one polyisocyanate having the formula $R^2-(NCO)_x$, where x is from about 1 to about 4, and $R^1$ is H, fluorine, chlorine, iodine, bromine, an alkyl with 1 to 44 carbon atoms, an aryl or alkyl substituted aryl with 6 to carbon atoms, and $R^2$ is an alkyl with 2 to 20 carbon atoms, a cycloalkyl with 4 to 20 carbon atoms, an aromatic or an alkyl substituted aromatic with 6 to 20 carbon atoms, or an aromatic substituted alkyl with 6 to 20 carbon atoms.

11. A thermoset composition according to claim 10, wherein $R^1$ is H, or an alkyl having 1 to 8 carbon atoms.

12. A thermoset composition according to claim 11, wherein the value of x is about 1.

13. A thermoset composition according to claim 11, wherein the value of x is from about 2 to about 3.

14. A thermoset composition according to claim 12, wherein $R^1$ is H or $CH_3$, and the aminostyrene compound has the amino group in the para position.

15. A thermoset composition according to claim 13, wherein $R^1$ is H or $CH_3$ and the aminostyrene compound has the amino group in the para position and wherein the epoxy oligomers are aliphatic epoxies, Bisphenol A based epoxies, resorcinol based, or combinations thereof.

* * * * *